(12) United States Patent
Nakamura

(10) Patent No.: US 6,393,082 B1
(45) Date of Patent: May 21, 2002

(54) SIGNAL SYNCHRONISM DETECTING CIRCUIT

(75) Inventor: Satoshi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/187,405

(22) Filed: Nov. 6, 1998

(30) Foreign Application Priority Data

Nov. 6, 1997 (JP) ............................................. 9-304548

(51) Int. Cl.$^7$ ................................................. H04L 7/00
(52) U.S. Cl. ........................ 375/368; 375/365; 370/509; 370/514
(58) Field of Search ................................ 375/368, 365, 375/366, 367, 364; 370/510, 509, 511, 512, 513, 514, 515

(56) References Cited

U.S. PATENT DOCUMENTS

| | | | | |
|---|---|---|---|---|
| 4,638,497 | A | * | 1/1987 | Komatsu et al. ............. 375/368 |
| 5,267,249 | A | * | 11/1993 | Dong ......................... 714/775 |
| 5,428,614 | A | * | 6/1995 | Shaver ........................ 370/474 |
| 5,608,735 | A | * | 3/1997 | McCullough et al. ........ 370/513 |

FOREIGN PATENT DOCUMENTS

| | | |
|---|---|---|
| JP | 4-291848 | 10/1952 |
| JP | 60-10833 | 1/1985 |
| JP | 62-226747 | 10/1987 |
| JP | 64-57850 | 3/1989 |
| JP | 2-87733 | 3/1990 |
| JP | 4-291848 | 10/1992 |
| JP | 5-268209 | 10/1993 |
| JP | 6-85775 | 3/1994 |

* cited by examiner

*Primary Examiner*—Tesfaldet Bocure
*Assistant Examiner*—Phuong Phu
(74) *Attorney, Agent, or Firm*—McGinn & Gibb, PLLC

(57) ABSTRACT

A signal synchronism detecting circuit comprises a receiving circuit receiving a serial data including data bit groups each composed of a predetermined number of continuing bits and delimiter bit groups each composed of a predetermined number of continuing bits for delimiting the data bit groups from one another, a detecting circuit for obtaining an exclusive OR between continuing bits of the received serial data, so as to detect the delimiter bit group, and a serial-to-parallel converting circuit for serial-to-parallel converting the received serial data on the basis of the result of the detection of the delimiter bit group by the detecting circuit.

18 Claims, 10 Drawing Sheets

DATA TRANSMISSION DIRECTION →

DATA TRANSMISSION DIRECTION →

*Fig. 8A* PRIOR ART
*Fig. 8B* PRIOR ART
*Fig. 8C* PRIOR ART
*Fig. 8D* PRIOR ART
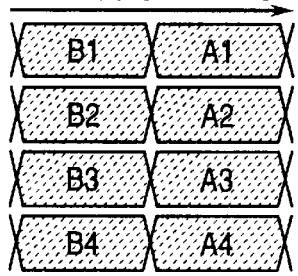
*Fig. 8E* PRIOR ART
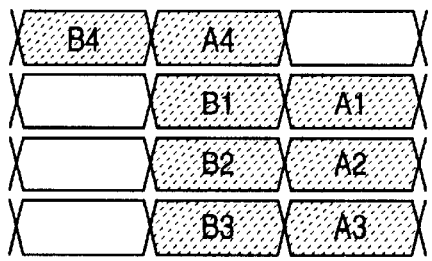
*Fig. 8F* PRIOR ART
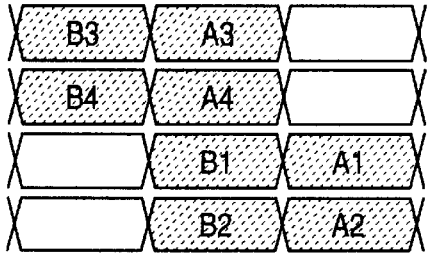
*Fig. 8G* PRIOR ART
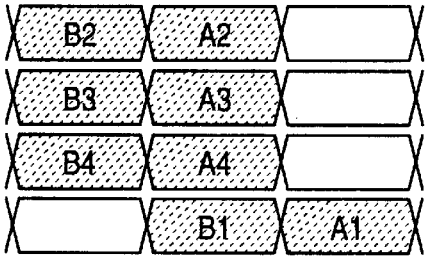

PRIOR ART DATA TRANSMISSION DIRECTION
*Fig. 9A*
*Fig. 9B*
PRIOR ART
1:2 P/S CONVERSION
2Gbps DATA TRANSMISSION DIRECTION
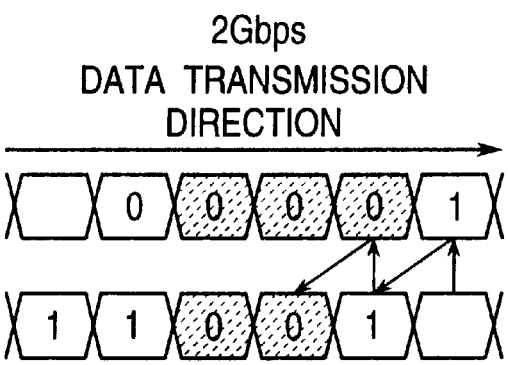
*Fig. 9C*
PRIOR ART
*Fig. 9D*
PRIOR ART
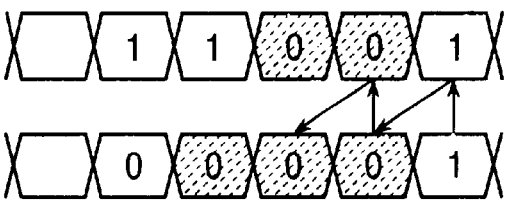
*Fig. 9E*
PRIOR ART
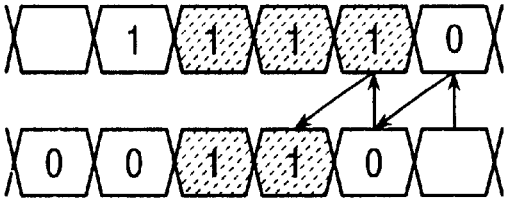
*Fig. 9F*
PRIOR ART
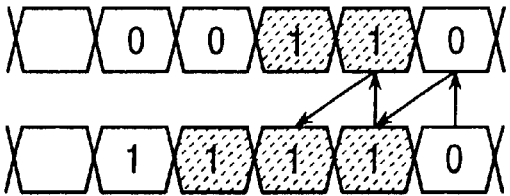

SIGNAL SYNCHRONISM DETECTING CIRCUIT

BACKGROUND OF THE INVENTION

1. Field of the Invention

The present invention relates to a signal synchronism detecting circuit, and more specifically to a signal synchronism detecting circuit having a serial-to-parallel conversion function of converting an inputted serial data in accordance with a predetermined signal.

2. Description of Related Art

In the prior art, there has been known a signal synchronism detecting circuit for detecting a word synchronism (frame synchronism, byte synchronism) discriminating the boundary or delimiter of bit groups in a time sequence in order to identify the roles of respective bits. In a high speed serial transmission field of a communication system, some of the signal synchronism detecting circuit has a function of receiving a high speed serial data coded by a 8B10B encoder and of executing a serial-to-parallel conversion. The high speed serial data includes a comma signal, which is a delimiter bit group for delimiting data bit groups (each formed of a predetermined number of continuing bits) from each other. The comma signal includes two kinds, namely, "1100000101" and its inversion "0011111010". The comma signal is used only at a heading of the word (frame, byte). A receiving side can properly perform the serial-to-parallel conversion by taking the word synchronism on the basis of the comma signal.

Here, a proper serial-to-parallel conversion is that when a received serial signal is serial-to-parallel-converted to restore a parallel signal before the sending, a heading bit of the serial data is correctly recognized, and the parallel signal is restored with no deviation in bit position.

Referring to FIGS. 8A to 8G, a general method for taking the word synchronism in the serial data is diagrammatically illustrated.

Here, consider that as shown in FIG. 8A, for example, two 4-bit parallel signals A1 to A4 and B1 and B4 of 1 Gbps are parallel-to-serial-converted to 4:1 at a sending side, and a serial data of 4 Gbps is received at a receiving side. When the serial data of 4 Gbps is serial-to-parallel-converted to 1:2 to generate two serial data trains, since the serial data of 4 Gbps is continuously received, if the data conversion of 1:2 is performed without taking the word synchronism, two data patterns shown in FIGS. 8B and 8C are obtained. Alternatively, when the serial data of 4 Gbps shown in FIG. 8A is serial-to-parallel-converted to 1:4, since the serial data of 4 Gbps is continuously received, if the data conversion of 1:4 is performed without taking the word synchronism, four data patterns shown in FIGS. 8D, 8E, 8F and 8G are obtained.

For example, if the word synchronism is conducted when the serial data of 4 Gbps shown in FIG. 8A is obtained, when the serial data is converted to the two serial data trains, the serial data is properly converted to the data pattern shown in FIG. 8B. In addition, when the serial data is converted to the four serial data trains, the serial data is properly converted to the data pattern shown in FIG. 8D. If the word synchronism is conducted when the serial data is converted to the two serial data trains of 2 Gbps, it is necessary to detect in which of the two conditions shown in FIGS. 8B and 8C the two serial data trains are. In addition, if the word synchronism is conducted when the serial data is converted to the four serial data trains of 1 Gbps, it is necessary to detect in which of the four conditions shown in FIGS. 8D to 8G the four serial data trains are.

Here, the case of taking the word synchronism for the serial data coded by the 8B10B encoder mentioned above will be described. In a fiber channel or the like, at a sender side, after the serial data is coded by the 8B10B encoder, the data is transmitted. At a receiving side, the word synchronism is taken in order to properly perform the serial-to-parallel conversion on the basis of the received serial data. In the serial data coded by the 8B10B encoding, the number of the same continuing bits (namely, continuing 0s or continuing 1s) is limited to 4 bits at maximum. Only one existing 5-bit signal formed of the same bits is 5 continuing 0s or 1s included in the comma signal.

FIGS. 9A to 9F diagrammatically illustrate how the word synchronism is taken on the basis of the comma signal. When two kinds of comma signal shown in of FIGS. 9A and 9B are received as the serial data of 4 Gbps, if the word synchronism is taken in the condition of 4 Gbps, it is sufficient if the above mentioned two kinds of bit group are detected. However, if the serial data is converted to two serial data trains without taking the word synchronism in the condition of 4 Gbps, the comma signal assumes four different patterns constituted by the two converted serial data trains of 2 Gbps, as shown in FIGS. 9C, 9D, 9E and 9F. Namely, if the word synchronism is taken in the condition of 2 Gbps, it is necessary to detect the word synchronism from the four different converted serial data train patterns.

Referring to FIG. 10, there is shown a circuit diagram of a prior art signal synchronism detecting circuit for the 4 Gbps serial data. The shown signal synchronism detecting circuit includes a 1/10 frequency dividing counter 21 receiving a clock signal of 4 Gbps, a serial-to-parallel converter section 22 and a data input section 23 formed of flipflops F/F-0 to F/F-9. In the word synchronous circuit having this construction, if the 4 Gbps serial data is inputted to the data input section 23, the word synchronism is taken by using the clock signal of 4 Gbps, and the serial-to-parallel conversion of 1:10 is performed to output a 10-bit parallel signal of 400 Mbps. Incidentally, "A" and "B" in FIG. 10 indicate the comma signal.

Referring to FIG. 11, there is shown a circuit diagram of a prior art signal synchronism detecting circuit for the 2 Gbps serial data. The shown signal synchronism detecting circuit includes a data input section 24, a 1/5 frequency dividing counter 26, and a serial-to-parallel converter section 27. The data input section 24 includes a converter section 25 for conducting a 1:2 data conversion for the received 4 Gbps serial data, so as to generate two serial data trains of 2 Gbps. In the word synchronous circuit having this construction, after the received 4 Gbps serial data is converted to the two serial data trains of 2 Gbps, the word synchronism is taken, and the serial-to-parallel conversion of 2:10 is performed to output a 10-bit parallel signal of 400 Mbps.

As mentioned above, if the signal synchronism such as the word synchronism is taken in the condition having a high bit rate, the number of patterns to be detected is small, and therefore, the circuit scale is small and the power consumption is low. In addition, since the clock frequency for operating the circuit to detect the signal synchronism is high, the data transfer delay occurring in the signal synchronism is small, and the latency of the overall system is small. However, since the synchronism is detected at the high bit rate, high speed operating circuits and devices become necessary. In addition, since it is necessary to distribute the high speed clock, there is possibility that a clock skew occurs between various circuit blocks. Therefore, there is a troublesome in cautiously distributing the high speed clock.

On the other hand, in the case that the signal synchronism is taken after the data conversion is conducted to lower the bit rate, the high speed operating circuits and devices become unnecessary, and correspondingly, since it also becomes unnecessary to distribute the high speed clock, there is no possibility of a clock skew. However, if the signal synchronism is taken after the bit rate is lowered, the number of patterns to be detected increases, and the scale of the circuit required for the synchronism detection correspondingly becomes large. Furthermore, since the clock frequency for operating the circuit to detect the signal synchronism is low, the data transfer delay occurring in the word synchronism becomes large, and the latency of the overall system also becomes large.

SUMMARY OF THE INVENTION

Accordingly, it is an object of the present invention to provide a signal synchronism detecting circuit which has overcome the above mentioned defect of the conventional one.

Another object of the present invention is to provide a signal synchronism detecting circuit having a relatively small circuit scale and capable of surely performing the serial-to-parallel conversion with a minimized data transfer delay in the synchronism detection and with a reduced power consumption.

The above and other objects of the present invention are achieved in accordance with the present invention by a signal synchronism detecting circuit comprising:
  a receiving means receiving a serial data including data bit groups each composed of a predetermined number of continuing bits and delimiter bit groups each composed of a predetermined number of continuing bits for delimiting the data bit groups from one another;
  a detecting means for obtaining an exclusive OR between continuing bits of the received serial data, so as to detect the delimiter bit group; and
  a serial-to-parallel converting means for serial-to-parallel converting the received serial data on the basis of the result of the detection of the delimiter bit group by the detecting means.

With the above mentioned arrangement, when the signal synchronism detection is conducted for the received serial data, the signal synchronism detection can be precisely conducted by only obtaining the exclusive OR between continuing bits of the received serial data. Therefore, the data transfer delay in the synchronism detection can be minimized and the power consumption can be reduced.

Preferably, the detecting means includes a plurality of exclusive-OR circuits each for obtaining an exclusive OR between one different pair of adjacent bits of the received serial data, a discriminating circuit receiving an output of each of the exclusive-OR circuits for discriminating whether or not the delimiter bit group exists, and a frequency dividing counter for outputting a timing signal to the serial-to-parallel converting means when the discriminating circuit detects the delimiter bit group. In this case, the signal synchronism detecting circuit can be constructed with a very simple circuit structure.

In a specific embodiment, the plurality of exclusive-OR circuits respectively obtain an exclusive OR between a different pair of adjacent bits of five continuing bits of the received serial data, so as to output continuing 0s of four bits when continuing 1s or 0s of five bits appear in the received serial data, and the discriminating circuit includes a logic circuit for outputting a trigger signal to the frequency dividing counter when the discriminating circuit receives the continuing 0s of four bits.

According to another aspect of the present invention, there is provided a signal synchronism detecting circuit comprising:
  a receiving means receiving a serial data including data bit groups each composed of a predetermined number of continuing bits and delimiter bit groups each composed of a predetermined number of continuing bits for delimiting the data bit groups from one another;
  a first converting means for alternately distributing continuing bits of the received serial data to generate two converted serial data trains;
  a first detecting means for obtaining an exclusive OR between continuing bits spread over the two converted serial data trains, so as to detect special bits included in the delimiter bit group and selected from the group consisting of a plurality of continuing 0s and a plurality of continuing 1s;
  a second detecting means for obtaining an exclusive OR between two bits which are composed of a bit just before the special bits in a bit transmission direction and a bit just after the special bits in the bit transmission direction, so as to detect whether or not the two bits are a combination of "1" and "0";
  a third detecting means for obtaining an exclusive OR between two bits which are composed of the bit just before the special bits in a bit transmission direction and a bit before the special bits by two bits in the bit transmission direction, so as to detect a heading bit of the continuing bits spread over the two converted serial data trains; and
  a serial-to-parallel converting means for serial-to-parallel converting the two converted serial data trains on the basis of the result of the detection of the first, second and third detecting means.

With the above mentioned arrangement, the signal synchronism is detected after the transfer rate of the received serial data is lowered, but the circuit scale is not enlarged. In addition, the signal synchronism can be detected with a simple construction which only obtains the exclusive-OR between predetermined bits in the converted serial data trains. Therefore, the data transfer delay in the synchronism detection can be minimized and the power consumption can be reduced.

Preferably, the first detecting means includes three exclusive-OR circuits each for obtaining an exclusive OR between one different pair of adjacent bits of four continuing bits spread over the two converted serial data trains. The second detecting means includes one exclusive-OR circuit for obtaining an exclusive OR between two bits which are composed of a bit just before the four continuing bits in a bit transmission direction and a bit just after the four continuing bits in the bit transmission direction. The third detecting means includes one exclusive-OR circuit for obtaining an exclusive OR between two bits which are composed of the bit just before the four continuing bits in a bit transmission direction and a bit before the four continuing bits by two bits in the bit transmission direction. In this case, the signal synchronism detecting circuit can be constructed with a very simple circuit structure.

Here, it should be understood that the exclusive-OR in the present invention includes an exclusive-NOR because the exclusive-NOR is a simple logical inversion of the output of the exclusive-OR.

The above and other objects, features and advantages of the present invention will be apparent from the following description of preferred embodiments of the invention with reference to the accompanying drawings.

BRIEF DESCRIPTION OF THE DRAWINGS

FIGS. 8A to 8G diagrammatically illustrate a general method for taking the word synchronism in the serial data;

FIGS. 9A to 9F diagrammatically illustrate how the word synchronism is taken on the basis of the comma signal;

DESCRIPTION OF THE PREFERRED EMBODIMENTS

Now, the principle of a first embodiment of the signal synchronism detecting circuit in accordance with the present invention will be described with reference to FIGS. 1A, 1B and 1C. This embodiment is the all signal synchronism detecting circuit so configured to take the word synchronism while maintaining the bit rate of the 4 Gbps serial data.

Figures 1A, 1B, 1C:
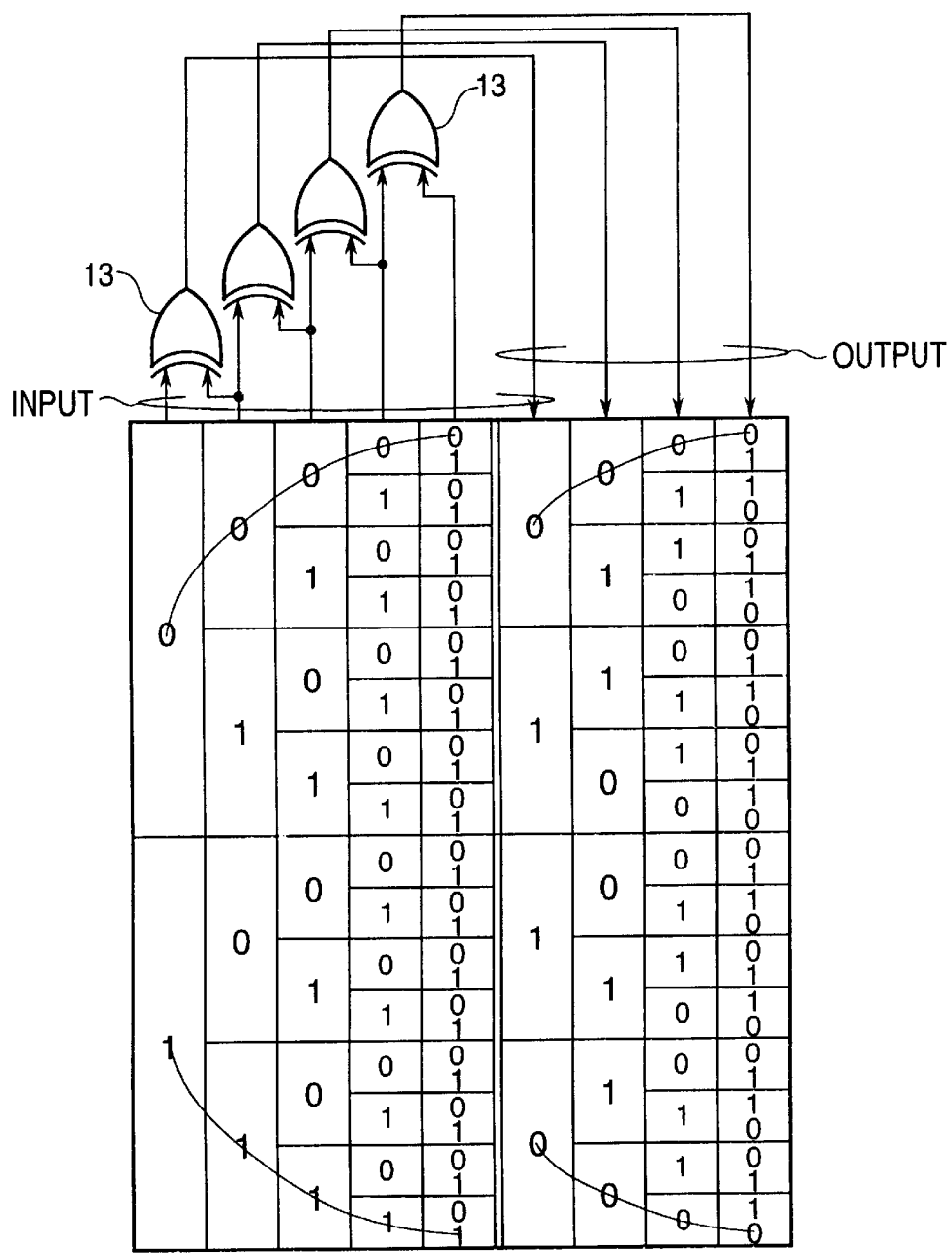
FIGS. 1A and 1B are diagrammatic view illustrating the comma signal included in the serial data.
FIG. 1C is a diagrammatic view of the synchronism detector receiving the serial data and an input and output signal table, for illustrating the principle of a first embodiment of the signal synchronism detecting circuit in accordance with the present invention.

FIGS. 1A and 1B illustrate two bit patterns of the comma signal included in the 4 Gbps serial data, namely, "1100000101" and "0011111010". FIG. 1C diagrammatically illustrates the synchronism detector receiving the serial data including the comma signal. The comma signal shown in FIG. 1A is composed of bits of "1" and "0" including continuing 0s of five bits, and the comma signal shown in FIG. 1B is composed of bits of "1" and "0" including continuing 1s of five bits.

The 4 Gbps serial data includes data bit groups each composed of continuing 10 bits and comma signals (delimiter bit groups) composed of a predetermined number of bits for delimiting the data bit groups from one another.

For example, four data bit groups exist following the comma signal, and another comma signal follows the four data bit groups, to delimit the four data bit groups from a next four data bit group.

Figure 2:
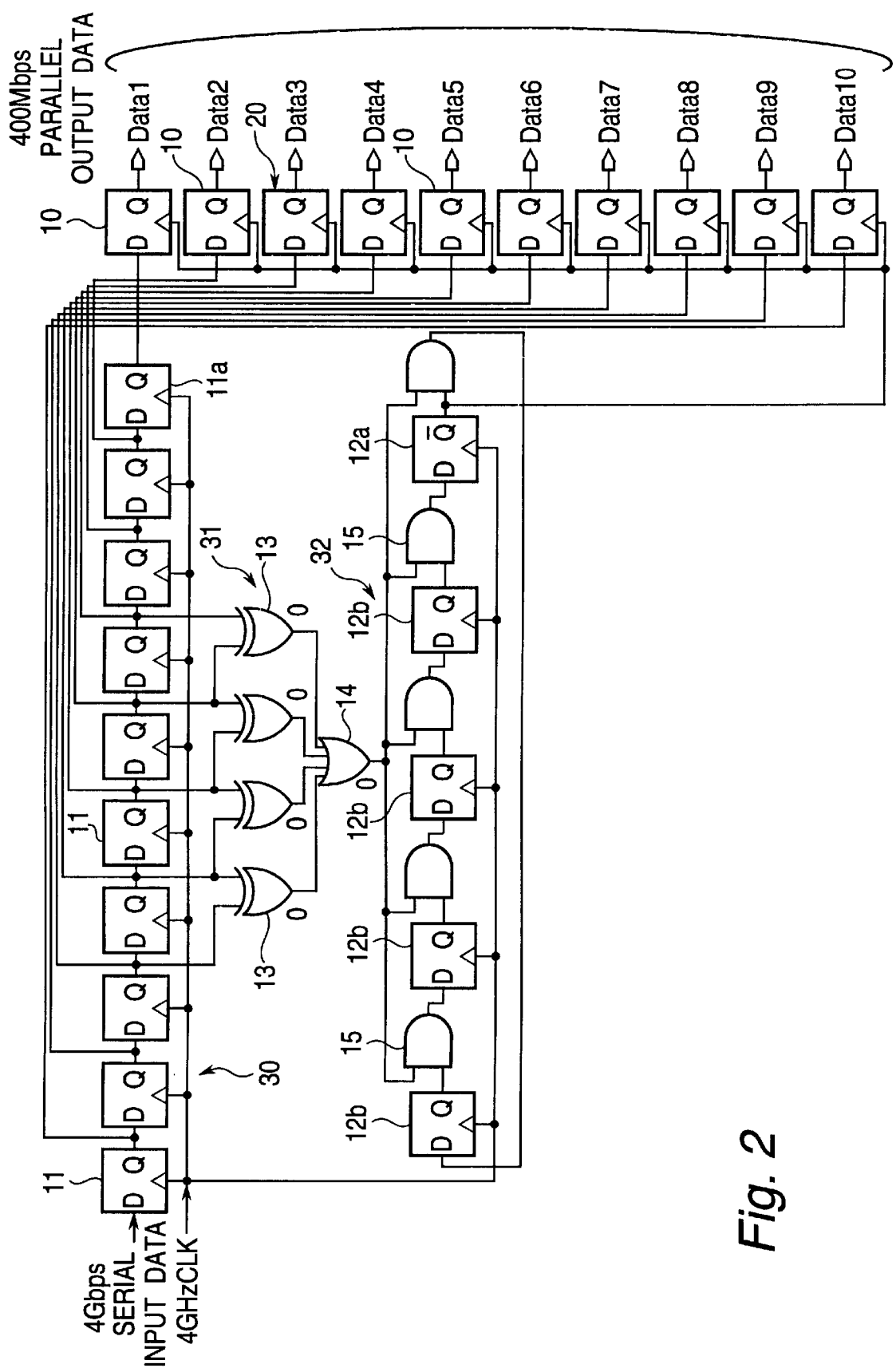
FIG. 2 is a circuit diagram of the first embodiment of the signal synchronism detecting circuit in accordance with the present invention.

The synchronism detector includes four exclusive-OR circuits 13 each for obtaining an exclusive-OR between continuing bits of the received serial data, so as to detect the comma signal and therefore to detect the synchronism of the data. As shown in FIG. 1C, the synchronism detector outputs continuing 0s of four bits, when 0s of 5 bits continue or when 1s of 5 bits continue. Thus, the only one extremely simple circuit can precisely execute the signal synchronism detection in the serial data including the two kinds of comma signal as shown in FIGS. 1A and 1B FIG. 2 is a circuit diagram of the first embodiment of the signal synchronism detecting circuit in accordance with the present invention. This signal synchronism detecting circuit is so configured to take the word synchronism in the received 40 Gbps serial data in the bit rate condition of 4 Gbps, and to perform a 1:10 serial-to-parallel conversion.

The shown signal synchronism detecting circuit includes a shift register 30, a synchronism detector 31, a 1/10 frequency dividing counter 32 and a serial-to-parallel converter 20.

The shift register 30 includes 10 cascaded D-type master-slave flipflops 11 connected as shown, and receives the 4 Gbps serial data and a clock signal of 4 Gbps. The synchronism detector 31 includes four exclusive-OR circuits 13 and one four-input OR circuit 14 connected as shown. The 1/10 frequency dividing counter 32 includes four D-type master-slave flipflops 12b and one D-type master-slave flipflop 12a having an inverted output, and five two-input AND circuits 15, which are alternately located and connected in cascade as shown. The serial-to-parallel converter 20 includes 10 cascaded D-type master-slave flipflops 10.

In the shift register 30, the inputted 4 Gbps serial data is shifted bit by bit by the clock signal of 4 Gbps. Since the 1/10 frequency dividing counter 32 is reset in response to the synchronism detection in the synchronism detector 31 (the detection of the comma signal), a clock signal of 400 MHz for the serial-to-parallel conversion is supplied to the serial-to-parallel converter 20.

On the basis of the clock signal of 400 MHz supplied from the 1/10 frequency dividing counter 32, the serial-to-parallel converter executes the 1:10 serial-to-parallel conversion. Namely, after the resetting, the four data bit groups (each consisting of 10 bits) following the comma signal is sequentially serial-to-parallel converted by action of the 1/10 frequency dividing counter 32 and the serial-to-parallel converter 20.

In the synchronism detector 31, the word synchronism detection is executed by detecting the comma signal by action of the exclusive-OR circuits 13 as a reference for a heading of a predetermined data bit groups, and a detection signal (trigger signal) is outputted from the four-input OR circuit 14. When the detection signal of "0" is outputted, the 1/10 frequency dividing counter 32 is reset, and at this timing, the clock signal of 400 MHz is supplied to the serial-to-parallel converter 20.

Actually, when the 1/10 frequency dividing counter 32 is reset after the signal synchronism detection, the 4 Gbps serial data is advanced through the shift register 30 by a few bits, and therefore, it is necessary to further shift the serial data at the timing of the resetting. For this purpose, an output of a heading flipflop circuit 11a of the shift register 30 is connected to an uppermost D-type master-slave flipflop circuit 10 in the serial-to-parallel converter 20, so that one extra stage is provided.

Now, a second embodiment of the signal synchronism detecting circuit in accordance with the present invention will be described with reference to FIGS. 3A to 3D, which illustrate the principle of the second embodiment of the signal synchronism detecting circuit in accordance with the present invention. FIGS. 3A to 3D illustrate different patterns of the comma signal included in two serial data trains obtained by conducting a 1:2 data conversion for the 4 Gbps serial data.

Figure 3A:
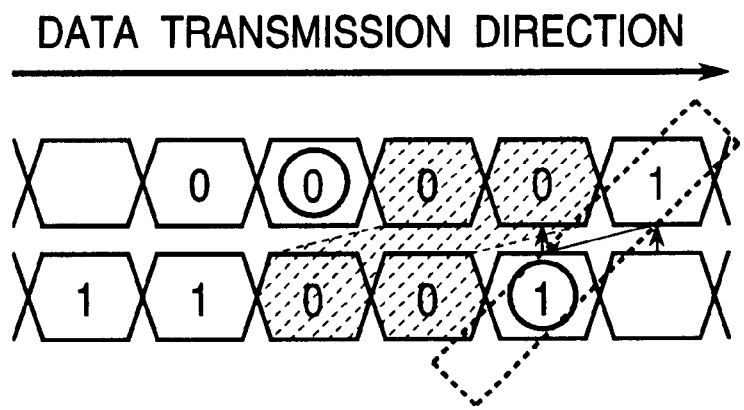
FIGS. 3A to 3D illustrate different patterns of the converted serial data trains, for illustrating the principle of a second embodiment of the signal synchronism detecting circuit in accordance with the present invention.
Figure 3B:
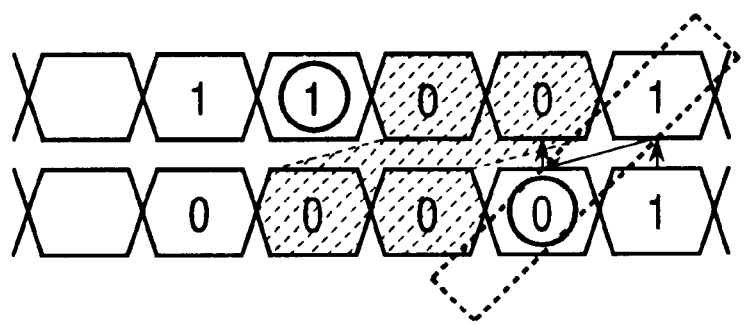
Figure 3C:
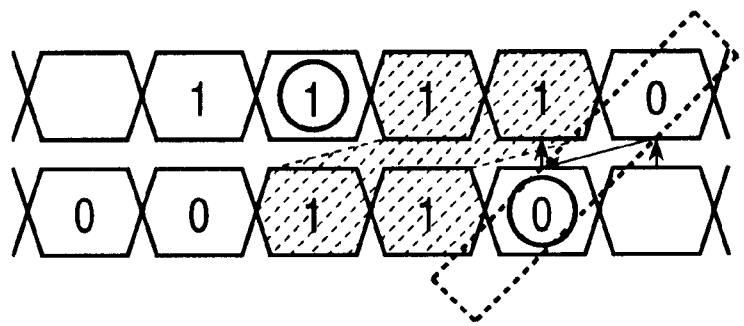
Figure 3D:
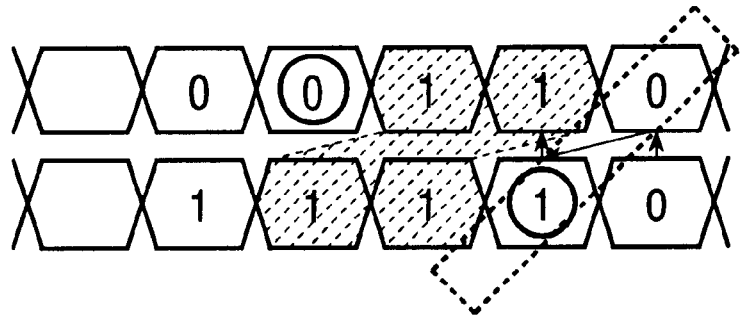

In FIGS. 3A to 3D, the continuing bits of the 4 Gbps serial data is alternately distributed to two, upper and lower bit trains, and the comma signals include the five continuing 0s or 1s distributed over the two serial data trains. A difference between FIGS. 3A and 3B and a difference between FIGS. 3C and 3D are to which of the two bit trains the heading bit of the converted serial data is distributed. In the patterns shown in FIGS. 3A and 3C, the heading bit of the converted serial data is distributed to the upper bit train, and in patterns shown in FIGS. 3B and 3D, the heading bit of the converted serial data is distributed to the lower bit train.

In this embodiment, it is necessary to detect whether or not there are five continuing bits of all 0s or all 1s, and also to detect to which of the patterns shown in FIGS. 3A to 3B the heading bit of the 1:2 serial-to-parallel converted data corresponds.

Figure 4:
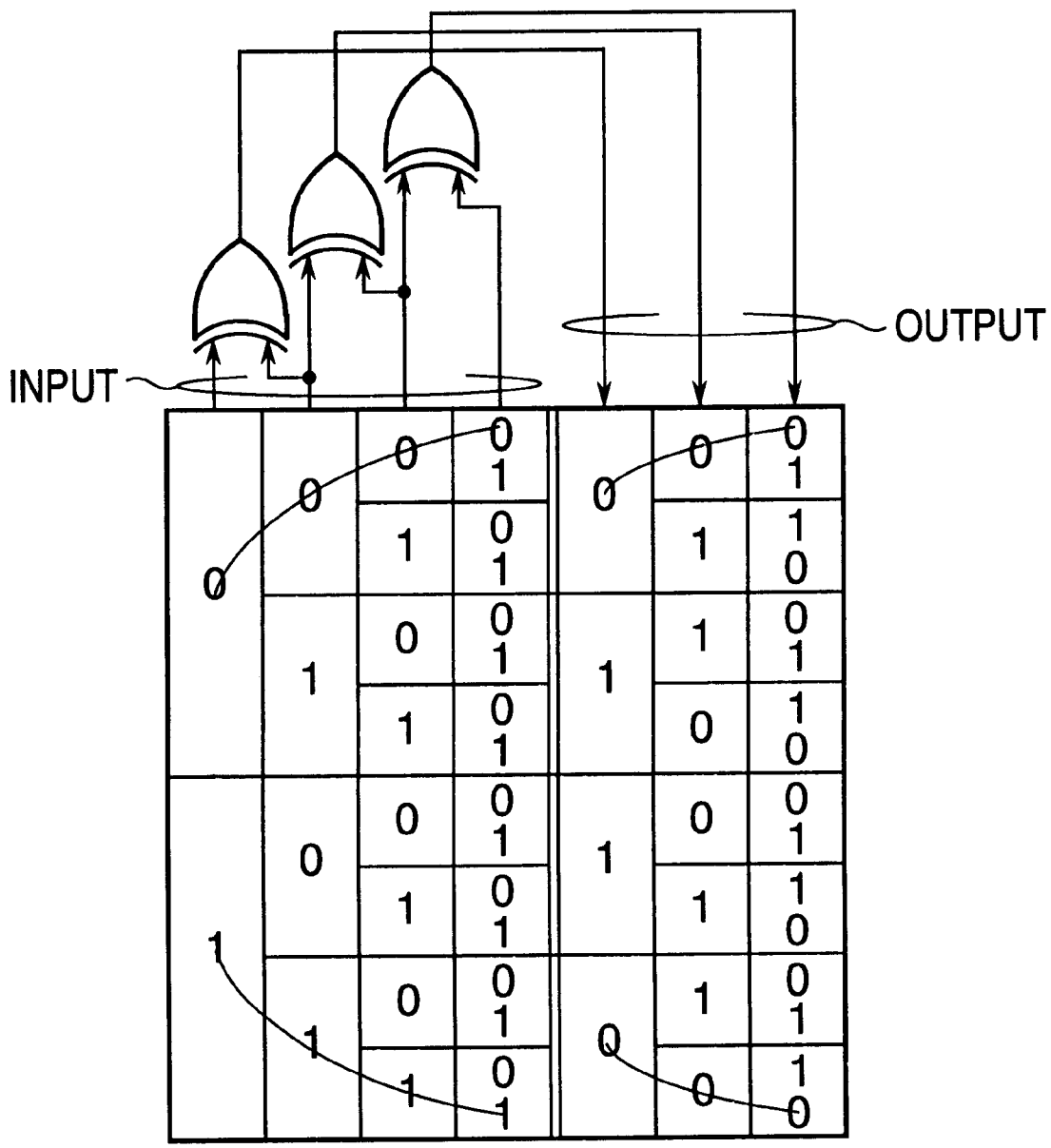
FIG. 4 is a diagrammatic view of the synchronism detecting circuit in the second embodiment and an input and output signal table.

FIG. 4 is a diagrammatic view of the signal synchronism detecting circuit in the second embodiment and an input and output signal table. In the signal synchronism detecting circuit, by obtaining an exclusive-OR between each different pair of continuing bits spread over the two converted serial data trains, a first detection is conducted for detecting special bits (four bits of all 1s or all 0s) within the five continuing bits of all 1s or all 0s in the comma signal. In this case, as shown in the input and output signal table of FIG. 4, the synchronism detector outputs only all 0s not only when the specific four bits are all 1s but al so when the specific four bits are all 0s. Therefore, the one simple circuit construction as shown in FIG. 4 can detect the four continuing bits (hatched in FIGS. 3A to 3D) of the five continuing bits.

Figure 5:
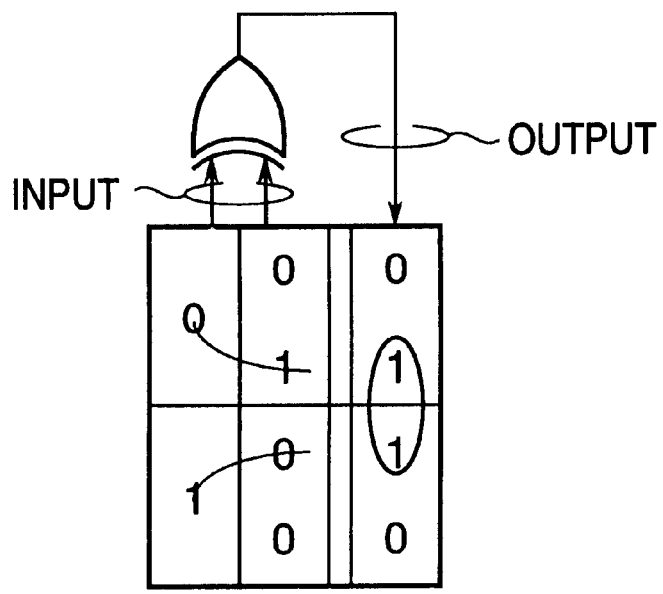
FIG. 5 is a diagrammatic view of the synchronism detecting circuit in the second embodiment and an input and output signal table.
Figure 6:
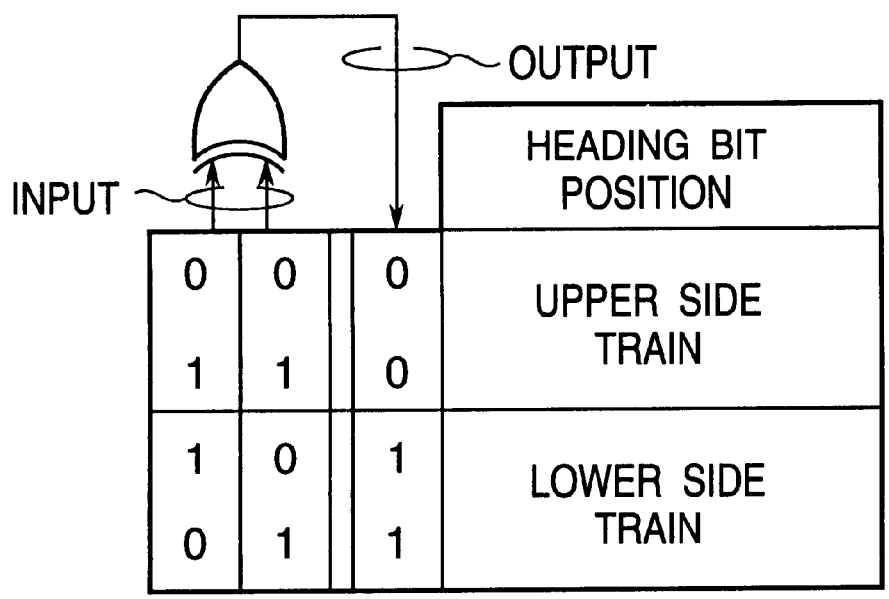
FIG. 6 is a diagrammatic view of the synchronism detecting circuit in the second embodiment and an input and output signal table.

FIG. 5 is a diagrammatic view of the signal synchronism detecting circuit in the second embodiment and an input and output signal table. Here, whether or not the four continuing bits detected in the first detection continue over five bits, is detected. From the nature of the comma signal, the same six bits do not continue. Therefore, when the four continuing bits of the special bits are detected, attention is paid to a bit just before the four continuing bits in a data transmission direction and a bit just after the four continuing bits in a data transmission direction. The combination of these two bits are "1" and "0" (as encircled in FIGS. 3A and 3D) or "0" and "1" (as encircled in FIGS. 3B and 3C). Therefore, a second detection is conducted by obtaining an exclusive-OR between these two bits just before and just after the four continuing bits of the special bits, and the result thus obtained is combined with the result of the first detection. Thus; the only simple circuit construction can surely detect the five continuing bits for the synchronism detection FIG. 6 is a diagrammatic view of the signal synchronism detecting circuit in the second embodiment and an input and output signal table. Here, in order to properly conduct the succeeding serial-to-parallel conversion, a third detection is conducted for the heading bit of the converted serial data including the comma signal detected by the first and second detections. This third detection is conducted by paying attention to a bit just before the four continuing bits of 1s or 0s hatched in FIGS. 3A to 3D in the bit transmission direction and another bit before the bit just before the four continuing bits in the bit transmission direction. These two bits are surrounded by a dotted line in FIGS. 3A to 3D.

As seen from the four patterns shown in FIGS. 3A to 3D, if the bit just before the four continuing bits and the bit before bit just before the four continuing bits are "1" and "1" or "0" and "0", the heading bit is included in the upper bit train, and if the bit just before the four continuing bits and the bit before bit just before the four continuing bits are "1" and "0" or "0" and "1", the heading bit is included in the lower bit train. Therefore, as shown in the input and output signal table of FIG. 6, by obtaining the exclusive-OR between these two bits concerned, the only one simple circuit construction can detect the heading bit.

By conducting all of the above mentioned first to third detections, it is possible to precisely detect the signal synchronism corresponding to all the four patterns shown in FIGS. 3A to 3D, on the basis of the result of the first to third detections.

Figure 7:
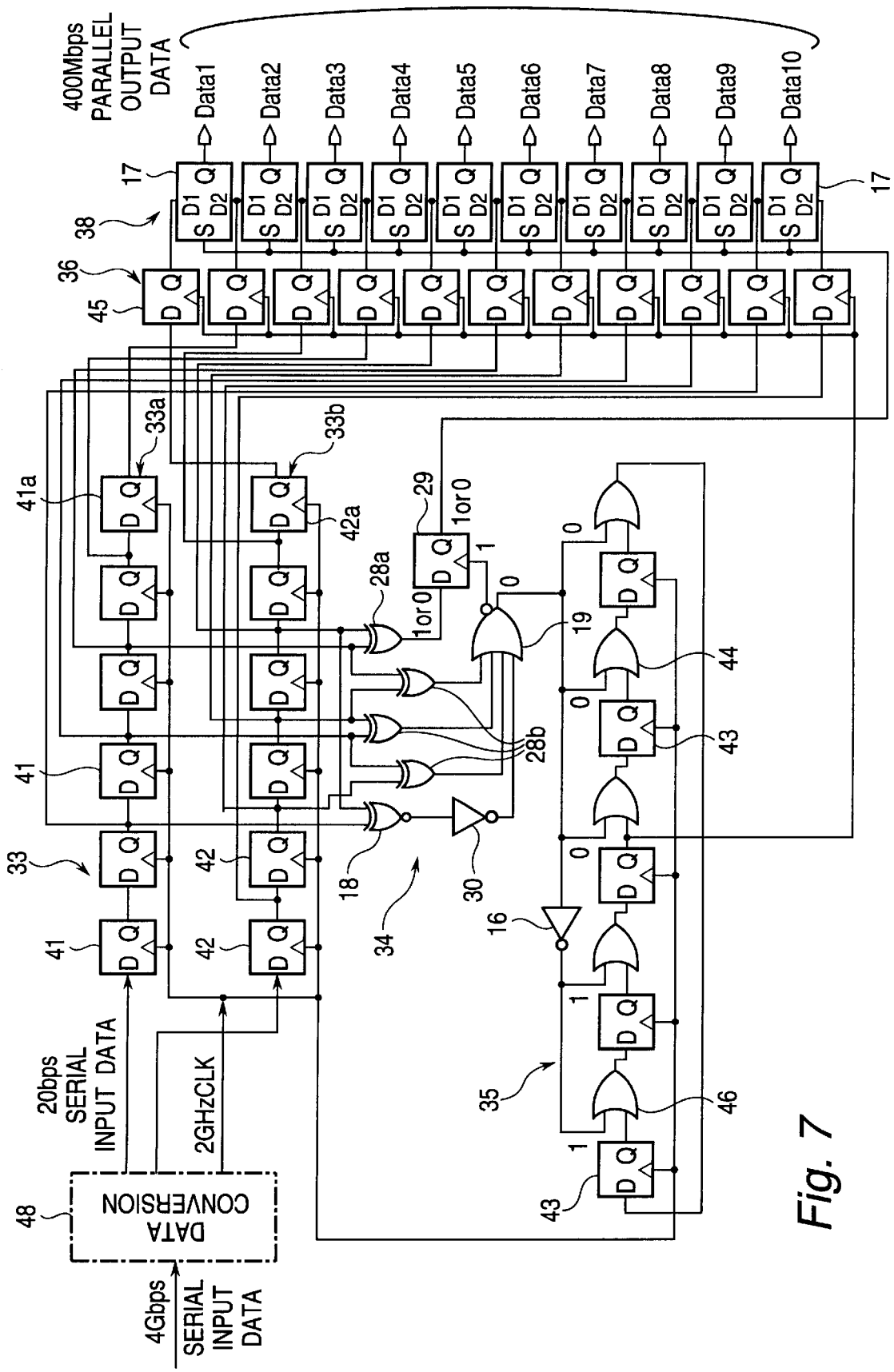
FIG. 7 is a circuit diagram of the second embodiment of the signal synchronism detecting circuit in accordance with the present invention.

Referring to FIG. 7, there is shown a circuit diagram of the second embodiment of the signal synchronism detecting circuit in accordance with the present invention. This signal synchronism detecting circuit receives the 4 Gbps serial data, conducts a 1:2 serial-to-parallel conversion, and detects the word synchronism at the bit rate condition of 2 Gbps and simultaneously conducts a 2:10 serial-to-parallel conversion. This signal synchronism detecting circuit includes a data converter (first converter) 48, a shifter register 33, a synchronism detector 34, a 1/5 frequency dividing counter 35, a serial-to-parallel converter (second converter) 36, and a selector 38.

The data converter 48 conducts the 1:2 data conversion for the received 4 Gbps serial data to output two converted serial data trains of 2 Gbps to the shifter register 33. The shifter register 33 includes a first data input section 33a composed of five cascaded D-type master-slave flipflop circuits 41 connected as shown, and a second input section 33b composed of five cascaded D-type master-slave flipflop circuits 42 connected as shown. The two converted serial data trains are supplied to the data input sections 33a and 33b, respectively, which receives a clock signal of 2 Gbps.

The synchronism detector 34 includes three exclusive-OR circuits 28b connected as shown to constitute a first detecting means, one exclusive-OR circuit 18 connected as shown to constitute a second detecting means, and one exclusive-OR circuit 28a connected as shown to constitute a third detecting means. The synchronism detector 34 further includes an inverter circuit 30 for inverting an output of the exclusive-OR circuit 18, a four-input OR/NOR circuit 19 and a D-type master-slave flipflop circuit 29, connected as shown. The D-type master-slave flipflop circuit 29 receives an output of the exclusive-OR circuit 28a and a NOR output of the four-input OR/NOR circuit 19, and outputs "1" or "0" to the selector 38.

The 1/5 frequency dividing counter 35 includes five D-type master-slave flipflop circuits 43, two-input OR circuits 46 inserted between the type master-slave flipflop circuits 43, and a two-input AND circuit 44, which are connected as shown.

The serial-to-parallel converter 36 includes 11 cascaded D-type master-slave flipflop circuits 45 connected as shown for conducting the 2:10 serial-to-parallel conversion for the two converted serial data trains. The flipflop circuits 42 of the second data input section 33b are connected to odd-numbered D-type master-slave flipflop circuit of the 11 cascaded D-type master-slave flipflop circuits 45, in the order from the heading flipflop 42a (right end flipflop) of the flipflop circuits 42, and the flipflop circuits 41 of the first data input section 33a are connected to even-numbered D-type master-slave flipflop circuit of the 11 cascaded D-type master-slave flipflop circuits 45, in the order from the heading flipflop 41a (right end flipflop) of the fipflop circuits 41. The output data outputted from the flipflop circuits 41 and 42 in the shift register 33 are connected to the D-type master-slave flipflop circuits 45 in the serial to-parallel converter 36, in a one-to-one relation.

The selector 38 includes 10 cascaded two-input one-output selectors 17 connected as shown to constitute a 2-to-1 selector capable of outputting a parallel data after shifting the output by one bit on the basis of the position of the heading bit in the received converted serial data trains. Namely, when the output of the flipflop circuit 29 is "0", a selector signal S is "0" and the selector 38 outputs D1 as the parallel data. When the output of the flipflop circuit 29 is "1", a selector signal S is "1" and the selector 38 outputs D2 as the parallel data. Thus, on the basis of the output of the flipflop circuit 29, the selector 38 selectively receives the data from the first to tenth flipflops 45 counted from the upper end in the drawing in the serial-to-parallel converter 36, or the data from the second to eleventh flipflops 45 counted from the upper end in the drawing in the serial-to-parallel converter 36, so that the parallel data constituted of D1 or D2 is outputted.

In this embodiment, the shift register 33 shifts the two converted serial data trains of 2 Gbps received from the data converter 48, bit by bit, response to the clock of 2 Gbps. The shifted converted serial data trains are sequentially supplied to the corresponding flipflops 45 in the serial-to-parallel converter 36.

In the synchronism detector 34, the exclusive-OR is obtained by the three exclusive-OR circuits 28b between each pair of adjacent bits of the continuing bits spread or distributed over the two converted serial data trains. When the same four continuing bits of the same five continuing bits of "1s" or "0s" included in the comma signal are detected by the three exclusive-OR circuits 28b, the three exclusive-OR circuits 28b output the three continuing bits of "0s". Furthermore, the exclusive-OR is obtained by the exclusive-OR circuit 18 between one bit just before the special bits in the bit transmission direction and one bit just after the special bits in the bit transmission direction, in order to detect whether or not the two bits concerned are a combination of "1" and "0".

Moreover, the exclusive-OR circuit 28a obtains the exclusive-OR between the bit just before the special bits in the bit transmission direction and one bit before the bit just before the special bits in the bit transmission direction, in order to detect whether or not the heading bit of the converted serial data trains including the same five continuing bits detected (comma signal) is any one of the bit patterns shown in FIGS. 3A to 3D. When the heading bit is included in the upper side converted serial data train, the preceding-by-one bit and the preceding-by-two bit are "1" and "1" (as surrounded by the dotted line in FIG. 3A) or "0" and "0" (as surrounded by the dotted line in FIG. 3C). When the heading bit is included in the lower side converted serial data train, the preceding-by-one bit and the preceding-by-two bit are "1" and "0" (as surrounded by the dotted line in FIG. 3B) or "0" and "1" (as surrounded by the dotted line in FIG. 3D). Namely, the heading bit is included in the upper side converted serial data train, when the result of the exclusive-OR is "0", and the heading bit is included in the lower side converted serial data train, when the result of the exclusive-OR is "1". On the basis of the result of this discrimination and the output of the four-input OR/NOR circuit 19, the flipflop circuit 29 outputs the signal of "1" or "0" when the synchronism is detected. The selector 38 is controlled on the basis of the output of the flipflop circuit 29.

The 1/5 frequency dividing counter 35 is reset by the trigger signal outputted from the four-input OR/NOR circuit 19, and supplies the clock signal of 400 MHz to the serial-to-parallel converter 36 in response to the resetting. The serial-to-parallel converter 36 conducts the 2:10 serial-to-parallel conversion in response to the clock signal of 400 MHz. Namely, after the resetting, the data bit groups following the comma signal are sequentially serial-to-parallel converted by the 1/5 frequency dividing counter 35 and the serial-to-parallel converter 36.

Actually, when the 1/5 frequency dividing counter 35 is reset after the signal synchronism detection, the 2 Gbps converted serial data trains are advanced through the shift register 33 by a few bits, and therefore, it is necessary to further shift the converted serial data trains at the timing of the resetting For this purpose, an output of the heading flipflop circuit 42a of the shift register 33 is connected to an uppermost D-type master-slave flipflop circuit 45 in the drawing in the serial-to-parallel converter 36, and an output of the heading flipflop circuit 41a of the shift register 33 is connected to a second D-type master-slave flipflop circuit 45 counted from the uppermost flipflop circuit in the drawing in the serial-to-parallel converter 36, so that one extra stage is provided.

Figure 10:
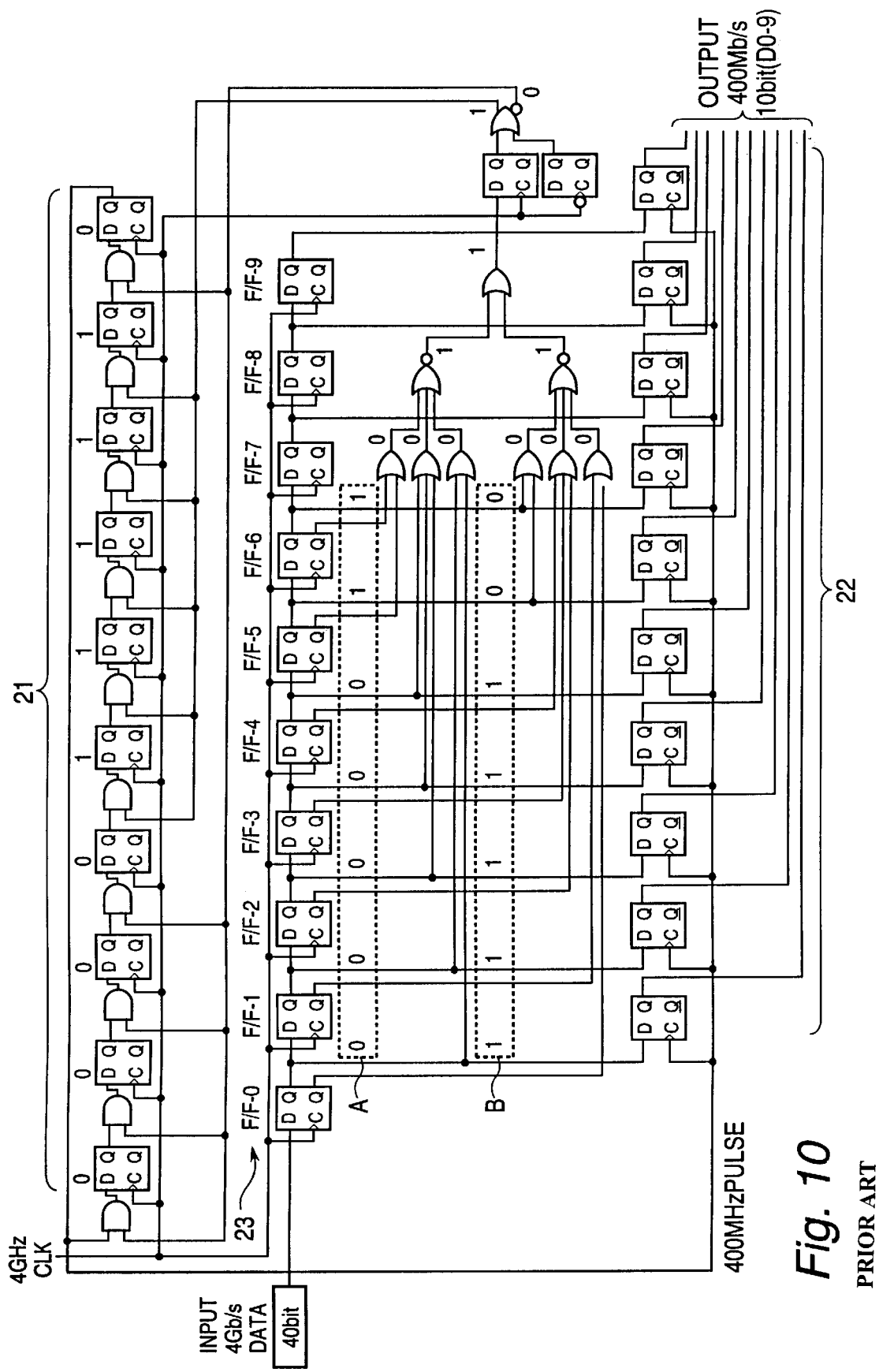
FIG. 10 is a circuit diagram of a prior art signal synchronism detecting circuit for the 4 Gbps serial data.
Figure 11:
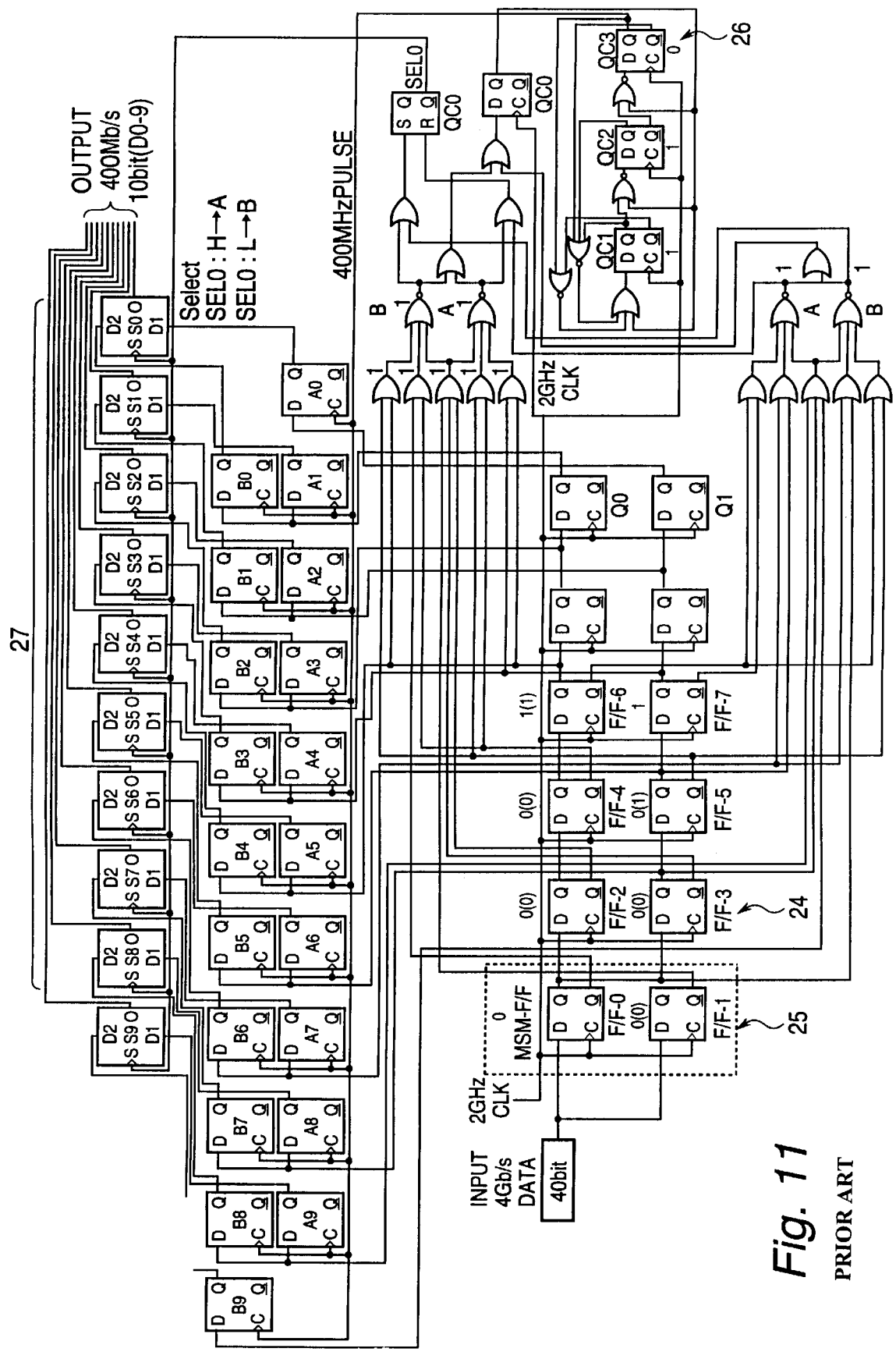
FIG. 11 is a circuit diagram of a prior art signal synchronism detecting circuit for the 2 Gbps serial data.

As seen from the above, the first and second embodiments of the signal synchronism detecting circuit are constituted of a small scale circuit having a reduced data delay in the synchronism detection, in comparison with the prior art shown in FIGS. 10 and 11, and therefore, the power consumption can be minimized in comparison with the prior art shown in FIGS. 10 and 11. Furthermore, it is possible to simultaneously conduct a bit separation conversion from the serial signal to the parallel signal, by using the detected synchronism signal.

In particular, in the first embodiment, since it is possible to minimize the distribution of the line for the high speed clock signal, it is possible to prevent the increase of the data transfer delay caused by the signal synchronism detection, and therefore to reduce the latency in the overall system. Furthermore, when the signal synchronism is detected in the condition of a high bit rate, the distribution of the line for the high speed clock signal can be shortened.

In the second embodiment, on the other hand, the signal synchronism is detected in the condition of a low bit rate, but the scale of the synchronism detecting circuit can be prevented from being enlarged.

The invention has thus been shown and described with reference to the specific embodiments. However, it should be noted that the present invention is in no way limited to the details of the illustrated structures but changes and modifications may be made within the scope of the appended claims.

What is claimed is:

1. A signal synchronism detecting circuit comprising:
   a receiving device for receiving a serial data including data bit groups each comprising a predetermined number of continuing bits and delimiter bit groups each comprising a predetermined number of continuing bits for delimiting said data bit groups from one another;
   a first converting device for alternately distributing continuing bits of the received serial data to generate two converted serial data trains;
   a first detecting device for performing an exclusive OR between continuing bits spread over said two converted serial data trains, so as to detect special bits included in said delimiter bit groups and selected from a group comprising a plurality of continuing first values and a plurality of continuing second values;
   a second detecting device for performing an exclusive OR operation between a plurality of bits which are comprised of a bit just before said special bits in a bit transmission direction and a bit just after said special bits in said bit transmission direction, so as to detect whether or not said two bits are a combination of said second values and said first values;

a third detecting device for performing an exclusive OR operation between a plurality of bits which are comprised of said bit just before said special bits in a bit transmission direction and a bit before said special bit by a plurality of bits in said bit transmission direction, so as to detect a heading bit of said continuing bits spread over said two converted serial data trains; and a serial-to-parallel converting device for serial-to-parallel converting said two converted serial data trains on the basis of the result of the detection of said first, second and third detecting devices.

2. A signal synchronism detecting circuit claimed in claim 1, wherein said first detecting device includes three exclusive-OR circuits each for performing an exclusive OR operation between one different pair of adjacent bits of four continuing bits spread over said two converted serial data trains, wherein said second detecting device includes an exclusive-OR circuit for performing an exclusive OR operation between a plurality of bits which are comprised of a bit just before said four continuing bits in a bit transmission direction and a bit just after said four continuing bits in said bit transmission direction, and wherein said third detecting device includes an exclusive-OR circuit for performing an exclusive OR operation between a plurality of bits which are comprised of said bit just before said four continuing bits in a bit transmission direction and a bit before said four continuing bits by a plurality of bits in said bit transmission direction.

3. A signal synchronism detecting circuit claimed in claim 1, wherein said first detecting device includes a plurality of exclusive-OR circuits each for performing an exclusive OR between one different pair of adjacent bits of four continuing bits spread over said two converted serial data trains.

4. A signal synchronism detecting circuit claimed in claim 1, wherein said second detecting device includes an exclusive-OR circuit for performing an exclusive OR operation between two bits which are comprised of a bit just before a set of four continuing bits in a bit transmission direction and a bit just after said four continuing bits in said bit transmission direction.

5. A signal synchronism detecting circuit claimed in claim 1, wherein said third detecting device includes an exclusive-OR circuit for performing an exclusive OR operation between two bits which are comprised of a bit just before a set of four continuing bits in a bit transmission direction and a bit before and four continuing bits by two bits in said bit transmission direction.

6. A signal synchronism detecting circuit claimed in claim 1, further comprising a selector configured to receive data from the serial-to-parallel converting device and selectively shifting the data one bit.

7. A signal synchronism detecting circuit claimed in claim 6, wherein the data is shifted based on a position of a heading bit in the serial data converted by the serial-to-parallel converting device.

8. A signal synchronism detecting circuit claimed in claim 1, wherein said first value comprises "0" and said second value comprises "1".

9. A signal synchronism detecting circuit comprising:

a first detecting device for performing an exclusive OR operation between continuing bits spread over a pair of converted serial data trains, so as to detect special bits included in a set of delimiter bit groups and selected from a group comprising a plurality of continuing first values and a plurality of continuing second values;

a second detecting device for performing an exclusive OR operation between a plurality of bits which are comprised of a bit just before said special bits in a bit transmission direction and a bit just after said special bits in said bit transmission direction, so as to detect whether or not said two bits are a combination of said second value and said first value; and a third detecting device for performing an exclusive OR operation between a plurality of bits which are comprised of said bit just before said special bits in a bit transmission direction and a bit before said special bit by a plurality of bits in said bit transmission direction, so as to detect a heading bit of said a plurality continuing bits spread over said plurality of converted serial data trains.

10. A signal synchronism detecting circuit claimed in claim 9, wherein said first detecting device includes a plurality of exclusive-OR circuits each for performing an exclusive OR operation between one different pair of adjacent bits of four continuing bits spread over said plurality of converted serial data trains.

11. A signal synchronism detecting circuit claimed in claim 9, wherein said second detecting device includes an exclusive-OR circuit for performing an exclusive OR operation between two bits which are comprised of a bit just before a set of four continuing bits in a bit transmission direction and a bit just after said four continuing bits in said bit transmission direction.

12. A signal synchronism detecting circuit claimed in claim 9, wherein said third detecting device includes an exclusive-OR circuit for performing an exclusive OR operation between two bits which are comprised of a bit just before a set four continuing bits in a bit transmission direction and a bit before and four continuing bits by a plurality of bits in said bit transmission direction.

13. A signal synchronism detecting circuit claimed in claim 9, further comprising a selector configured to receive data from a serial-to-parallel converting device and selectively shifting the data one bit.

14. A signal synchronism detecting circuit claimed in claim 9, wherein the data is shifted based on a position of a heading bit in the serial data converted by the serial-to-parallel converting device.

15. A signal synchronism detecting circuit for processing a received serial data set, said circuit comprising:

a first detecting device comprising a plurality of an exclusive-OR circuits each for performing an exclusive OR operation between a different pair of adjacent bits of a plurality of continuing bits spread over a plurality of converted serial data trains;

a second detecting device comprising an exclusive-OR circuit for performing an exclusive OR operation between a plurality of bits which are comprised of a bit just before said plurality of continuing bits in a bit transmission direction and a bit just after said plurality of continuing bits in said bit transmission direction; and a third detecting device comprising an exclusive-OR circuit for performing an exclusive OR between two bits which are comprised of said bit just before said plurality of continuing bits in a bit transmission direction and a bit before said plurality of continuing bits by a plurality of bits in said bit transmission direction.

16. A signal synchronism detecting circuit claimed in claim 15, wherein the first detecting device comprises three exclusive-OR circuits.

17. A signal synchronism detecting circuit claimed in claim 15, wherein the exclusive-OR circuit of the second detecting device is configured to perform an exclusive OR operation between a first pair of bits.

18. A signal synchronism detecting circuit claimed in claim 17, wherein the exclusive-OR circuit of the third detecting device is configured to perform an exclusive OR operation between a second pair of bits adjacent to said first pair of bits.

* * * * *